United States Patent
Katagiri et al.

(10) Patent No.: US 9,184,133 B2
(45) Date of Patent: Nov. 10, 2015

(54) GRAPHENE WIRING AND SEMICONDUCTOR DEVICE

(71) Applicant: Kabushiki Kaisha Toshiba, Minato-ku (JP)

(72) Inventors: Masayuki Katagiri, Kawasaki (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/658,442

(22) Filed: Mar. 16, 2015

(65) Prior Publication Data

US 2015/0270226 A1    Sep. 24, 2015

(30) Foreign Application Priority Data

Mar. 20, 2014   (JP) .................................. 2014-058842

(51) Int. Cl.
*H01L 23/532* (2006.01)
(52) U.S. Cl.
CPC ................................ *H01L 23/53276* (2013.01)
(58) Field of Classification Search
USPC ................... 257/210, 774, 773; 977/734, 779
See application file for complete search history.

(56) References Cited

U.S. PATENT DOCUMENTS

| 2011/0101528 | A1 | 5/2011 | Akimoto et al. |
| 2011/0233779 | A1* | 9/2011 | Wada et al. .................. 257/751 |
| 2013/0075929 | A1 | 3/2013 | Katagiri et al. |
| 2014/0162464 | A1* | 6/2014 | Dimitrakopoulos et al. . 438/761 |

FOREIGN PATENT DOCUMENTS

| JP | 2009-70911 | 4/2009 |
| JP | 2011-96980 | 5/2011 |
| JP | 2013-74034 | 4/2013 |

\* cited by examiner

*Primary Examiner* — Jasmine Clark
(74) *Attorney, Agent, or Firm* — Oblon, McClelland, Maier & Neustadt, L.L.P.

(57) ABSTRACT

A graphene wiring of an embodiment includes graphene, first conductive layers, second conductive layers, and a third conductive layer. The first conductive layers are connected to first sides of the graphene opposite to each other in a longitudinal direction of the wiring. The second conductive layers are connected to second sides of the graphene opposite to each other in a widthwise direction of the wiring. The third conductive layer is connected to a top surface of the graphene. The first and second conductive layers are connected to each other.

12 Claims, 8 Drawing Sheets

GRAPHENE WIRING AND SEMICONDUCTOR DEVICE

CROSS-REFERENCE TO RELATED APPLICATION

This application is based upon and claims the benefit of priority from Japanese Patent Application No. 2014-058842 Mar. 20, 2014; the entire contents of which are incorporated herein by reference.

FIELD

Embodiments described herein relate to a graphene wiring and semiconductor device.

BACKGROUND

As LSIs and 3D memories become finer and more multi-layered, an increase in metal wiring delay has become an important problem. To reduce wiring delay, it is important to reduce wiring resistance and interwiring capacity. To reduce wiring resistance, low-resistance materials such as Cu have been put into practical use. However, even Cu wiring has problems such as stress migration- or electromigration-induced degradation of reliability and size effect-induced increase in electric resistivity. Therefore, there has been a demand for wiring materials with lower resistivity and higher current density tolerance.

Next-generation wiring materials expected to have lower resistance and higher reliability include carbon-based materials, such as carbon nanotubes and graphene, which have excellent physical properties such as high current density tolerance, high electrical conductivity, and high thermal conductivity. Attention is given to applications of such carbon-based materials.

DETAILED DESCRIPTION

Figure 1:
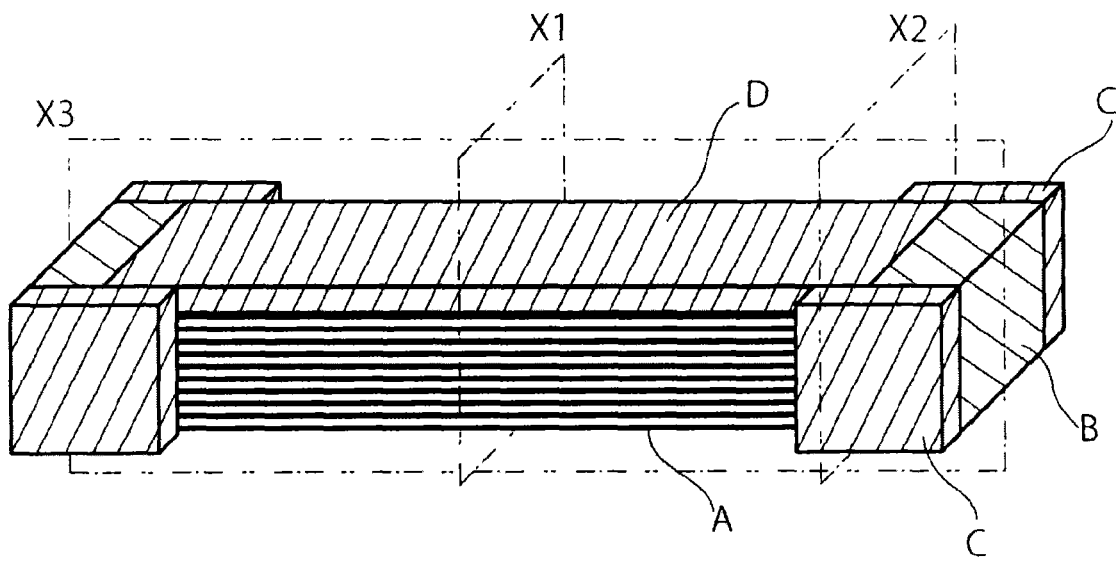
FIG. 1 is a schematic perspective view of a wiring of an embodiment.

A graphene wiring of an embodiment includes graphene, first conductive layers, second conductive layers, and a third conductive layer. The first conductive layers are connected to first sides of the graphene opposite to each other in a longitudinal direction of the wiring. The second conductive layers are connected to second sides of the graphene opposite to each other in a widthwise direction of the wiring. The third conductive layer is connected to a top surface of the graphene. The first and second conductive layers are connected to each other.

In a multilayer wiring structure, via wiring (vertical wiring) is used for interlayer connection. In the case of graphene wiring (horizontal direction), in the connection to via wiring, graphene and the via wiring are connected through a conductive layer. To form a low-resistance connection between via wiring and graphene, the conductive layer needs to form a good contact with both the via wiring and the graphene. A metal film or carbon nanotubes are preferably used to form via wiring. A good contact can be easily formed between via wiring and a conductive layer because the contact area between them can be relatively large. However, there is concern that the contact resistance between graphene and a conductive layer would be high because a single graphene sheet has a thickness of one atom so that the contact area between the graphene sheet and the conductive layer is small relative to the wiring cross section. Thus, an embodiment provides a graphene wiring having a low-resistance contact structure.

The graphene may be either monolayer graphene including a layer of graphene sheet (nanoribbon) or multilayer graphene in which graphene sheets are stacked. The graphene is preferably multilayer graphene in view of conductivity. In the case of multilayer graphene, the conductive layer can be connected to the layered surface of the graphene. The wiring of an embodiment increases the contact area between the graphene and the conductive layer. Specifically, the wiring of an embodiment includes graphene, first conductive layers, second conductive layers, and a third conductive layer. The first conductive layers are connected to the first sides of the graphene opposite to each other in the longitudinal direction of the wiring. The second conductive layers are connected to the second sides of the graphene opposite to each other in the widthwise direction of the wiring. The third conductive layer is connected to the top surface of the graphene. The first and second conductive layers are further connected to each other. The opposite sides of the graphene or the conductive layer are a pair of two sides. A pair of two sides is preferably used for the contact between the graphene and the second conductive layers. However, one side contact can also contribute to a reduction in the contact resistance between the graphene and the second conductive layer.

The contact resistance between the first conductive layers and the graphene is further reduced when the first conductive layers connected to the graphene is further connected to the second conductive layers connected to the graphene. The wiring of an embodiment is preferably used to form a semiconductor device having horizontal graphene wiring and via vertical wiring connected to each other through a conductive layer.

The first conductive layers are connected to the graphene and may be further connected to vertical wiring and so on (not shown). The first conductive layers are connected to the end faces of the graphene (the sides of the graphene opposite to each other in the longitudinal direction of the wiring). This connection area is relatively small. The first conductive layers are connected to the second conductive layers that are connected to the second sides of the graphene (the second sides of the graphene opposite to each other in the widthwise direction of the wiring). This connection successfully reduces the contact resistance between the first conductive layers and the graphene via the second conductive layers. Preferably, the whole of the first sides of the graphene opposite to each other in the longitudinal direction of the wiring are connected to the first conductive layers.

The second conductive layers are connected to the sides of the graphene, different from the first sides connected to the first conductive layers (the second sides of the graphene opposite to each other in the widthwise direction of the wiring). The second conductive layers are further connected to the first conductive layers. The second conductive layers connected to the first conductive layers are connected to at least part of the second sides of the graphene opposite to each other in the widthwise direction of the wiring. This connection successfully reduces the contact resistance between the first conductive layers and the graphene. The second conductive layer or layers are connected to the side of the first conductive layer connected to the graphene and to one or both of the second sides of the graphene opposite to each other in the widthwise direction of the wiring of the first conductive layer. The second conductive layers connected to the first conductive layers are preferably connected to the whole of the second sides of the graphene opposite to each other in the widthwise direction of the wiring, so that the connection area between the second conductive layers and the graphene can be increased and the contact resistance between the first conductive layers and the graphene can be reduced. When some parts of the sides of the graphene, opposite to each other in the widthwise direction of the wiring, remain not connected to the second conductive layers, such parts may be in contact with, for example, an interlayer insulating film.

The third conductive layer is formed on the top surface of the graphene, so that the graphene can be doped with a metal from the third conductive layer. When doped, the graphene can have higher conductivity. For doping, the third conductive layer only needs to be formed on the top surface of the graphene, and more preferably, the third conductive layer is formed over the entire top surface of the graphene. In order to improve the contact resistance between the first conductive layers and the graphene, the third conductive layer is preferably connected to one or both of the first and second conductive layers. In view of conductivity with the graphene, at least one of the first, second, and third conductive layers is preferably connected by adhesion to the graphene.

FIG. 1 is a schematic perspective view showing a wiring of an embodiment. The wiring of FIG. 1 includes graphene A, first conductive layers B connected to the sides of the graphene A opposite to each other in the longitudinal direction of the wiring, second conductive layers C connected to the first conductive layers and connected to part of the sides of the graphene A opposite to each other in the widthwise direction of the wiring, and a third conductive layer D connected to the top surface of the graphene A. In the drawings, L indicates the longitudinal direction of the wiring.

Figure 2:
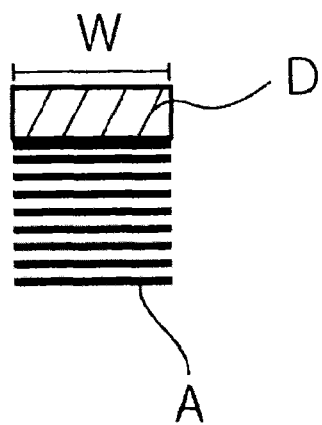
FIG. 2 is a schematic cross-sectional view of a wiring of an embodiment.
Figure 3:
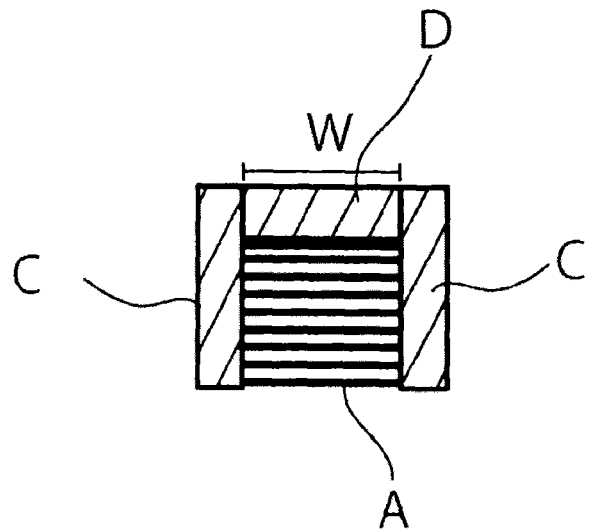
FIG. 3 is a schematic cross-sectional view of a wiring of an embodiment.
Figure 4:
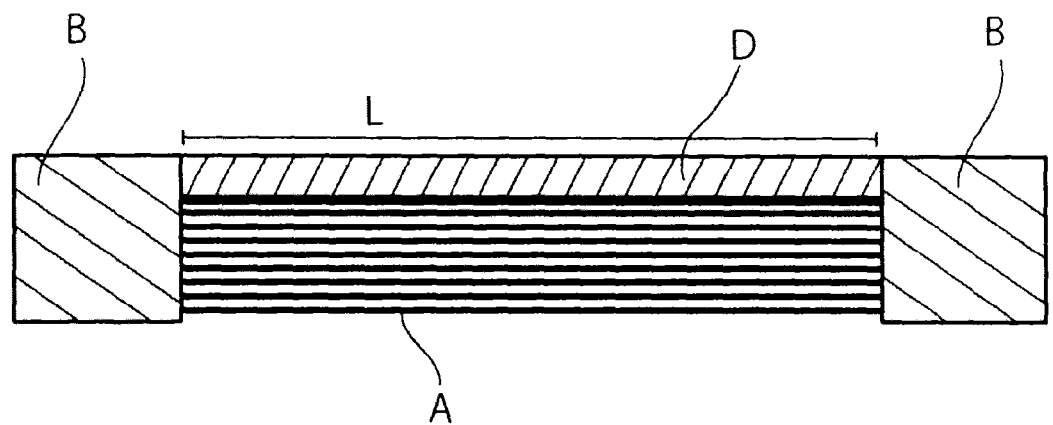
FIG. 4 is a schematic cross-sectional view of a wiring of an embodiment.

FIGS. 2 to 4 are cross-sectional views showing the wiring of FIG. 1 from other directions. FIG. 2 is a schematic cross-sectional view of the section X1 in FIG. 1. FIG. 2 shows a section in which the graphene A is connected to the third conductive layer D. In the drawings, W indicates the widthwise direction of the wiring. FIG. 3 is a schematic cross-sectional view of the section X2 in FIG. 1. FIG. 3 shows a section in which the graphene A is connected to the third conductive layer D, and the second sides of the graphene A opposite to each other in the widthwise direction of the wiring are connected to the second conductive layers C. As shown in FIGS. 1 and 3, the second sides of the first conductive layers B opposite to each other in the widthwise direction of the wiring are connected to the second conductive layers. FIG. 4 is a schematic cross-sectional view of the section X3 in FIG. 1. FIG. 4 shows a section in which the graphene A is connected to the third conductive layer D, and the first sides of the graphene A opposite to each other in the longitudinal direction of the wiring are connected to the first conductive layers B.

Figure 5:
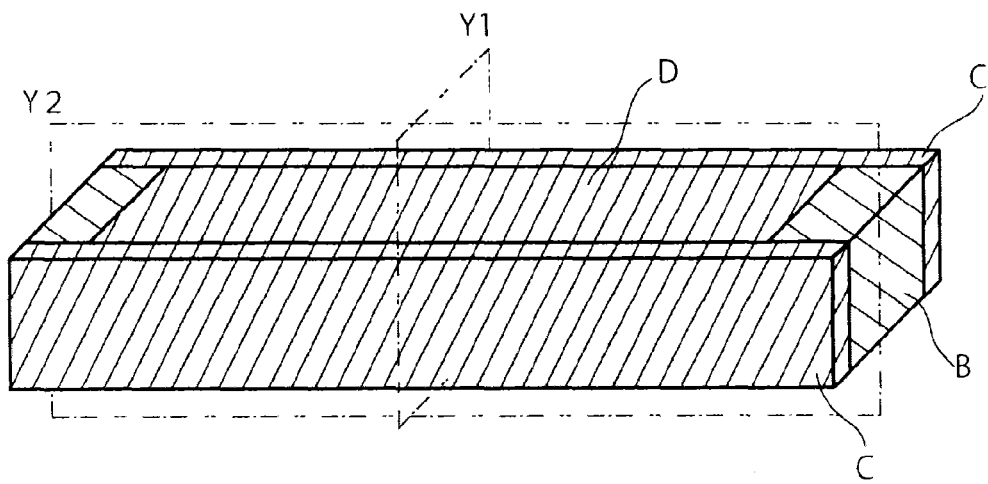
FIG. 5 is a schematic perspective view of a wiring of an embodiment.

FIG. 5 is a schematic perspective view showing another mode of a wiring different from that shown in FIG. 1. The wiring of FIG. 5 includes graphene A, first conductive layers B connected to the first sides of the graphene A opposite to each other in the longitudinal direction of the wiring, second conductive layers C connected to the first conductive layers and connected to the whole of the second sides of the graphene A opposite to each other in the widthwise direction of the wiring, and a third conductive layer D connected to the top surface of the graphene A. The section Y1 of the wiring of FIG. 5 is the same as the section of FIG. 3. The section Y2 of the wiring of FIG. 5 is the same as the section of FIG. 4. FIG. 5 does not clearly show the perspective shape of the graphene A because the whole of the second sides of the graphene A opposite to each other in the widthwise direction of the wiring are connected to the second conductive layers C.

When a good contact is made between the graphene A and the first and second conductive layers B and C, the graphene wiring can have a reduced resistance. To make a good contact, for example, it is preferred to use a metal with a high carbon solubility limit, a metal capable of easily forming a carbide, a catalytic metal, or the like for the first and second conductive layers B and C.

The graphene A typically has a width of 5 nm to 100 nm. If the wiring width is narrow, the sides of the graphene A opposite to each other in the longitudinal direction of the wiring have a relatively small area. Therefore, a good contact should preferably be made between the graphene A and the first and second conductive layers B and C so that the effect of reducing the contact resistance can be significant. The wiring width can be measured, for example, using a transmission electron microscope.

Hereinafter, the graphene wiring will be more specifically described with reference to the drawings of examples.

Example 1

Figure 6:
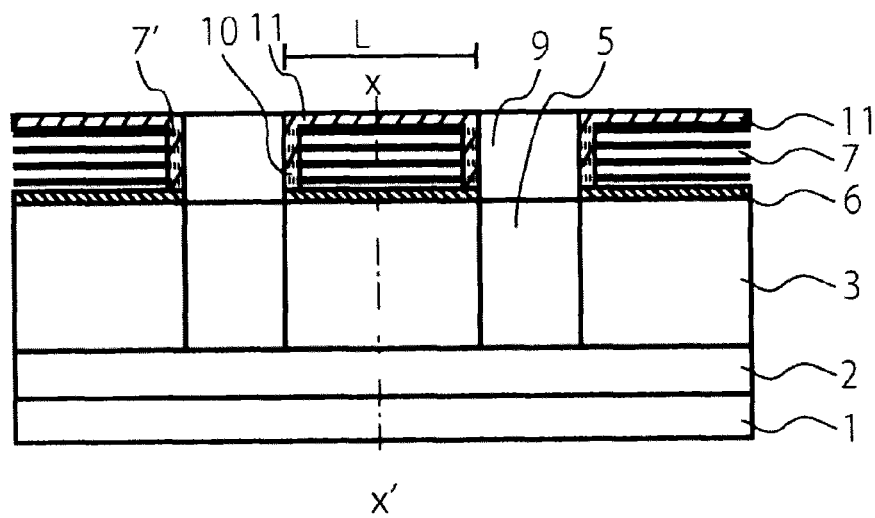
FIG. 6 is a schematic cross-sectional view of a semiconductor device having a wiring of an embodiment.

FIG. 6 is a schematic cross-sectional view of part of a semiconductor device of Example 1 including vertical wiring (via wiring) and horizontal wiring (graphene wiring). L represents the longitudinal direction of the horizontal wiring, and W (FIG. 7) represents the widthwise direction. The wiring of FIG. 6 includes a substrate 1, a lower wiring layer 2 on the substrate 1, a first interlayer insulating film 3 on the lower wiring layer 2, via wiring 5 provided on the lower wiring layer 2 to connect the lower wiring layer 2 to an upper wiring layer, a catalyst metal film 6 on the first interlayer insulating film 3, graphene 7 on the catalyst metal film 6, first conductive layers 9 provided on the via wiring 5 and connected to the graphene 7, second conductive layers 10 connected to the first conductive layers 9 and the graphene 7, and a third conductive layer 11 on the graphene 7 (top surface).

Figure 7:
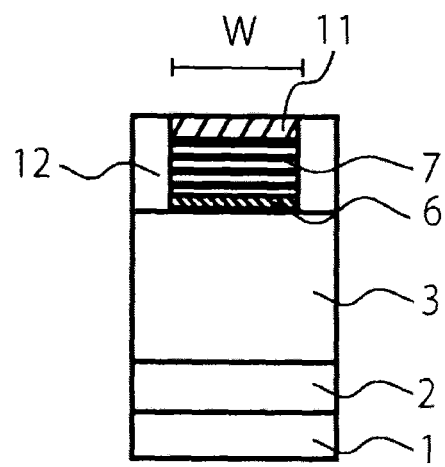
FIG. 7 is a schematic cross-sectional view of a semiconductor device having a wiring of an embodiment.

FIG. 7 is a cross-sectional view along the line x-x' in FIG. 6. The second sides of the graphene 7 opposite to each other in the widthwise direction of the wiring are in contact with second interlayer insulating films 12. The first and second interlayer insulating films 3 and 12 may be integrally made of the same material.

The first sides of the graphene 7 opposite to each other in the longitudinal direction of the wiring are connected to the first conductive layers 9. Part of the second sides of the graphene 7 opposite to each other in the widthwise direction of the wiring are connected to the second conductive layers 10. In the section of FIG. 6, the graphene 7 connected to the second conductive layers 10 is covered with the second conductive layer 10 and is actually not exposed. For the same of convenience, the graphene which is not actually exposed in the section of FIG. 6 is assigned reference numeral 7' and indicated by a broken line in FIG. 6.

The substrate 1 is for example, a semiconductor substrate on which a circuit including transistors, diodes, and other components is formed. Although not shown, a substrate or wiring may be provided on the top or other side of the graphene 7.

The lower wiring layer 2 is a conductive layer provided to form wiring between the substrate 1 and the via wiring 5. The lower wiring layer 2 has a layer of a single conductive material different from the substrate 1 or a multilayer structure in which two or more conductive materials different from the substrate 1 are stacked. Conductive materials for the lower wiring layer 2 may include monolayer or multilayer graphene, metals including elements such as Cu, W, Al, and Si (silicide), alloys containing any of these metals, etc. The lower wiring layer 2 may also include a structure in which graphene and a metal (alloy) are stacked. The lower wiring layer 2 preferably forms a low-resistance contact with the via wiring 5.

The first interlayer insulating film 3 is an insulating film provided between the graphene 7 and the lower wiring layer 2. The first interlayer insulating film 3 has via holes (contact holes) 4 in its insulating layer. The via holes 4 pass through the first interlayer insulating film 3. The first interlayer insulating film 3 is preferably made of a low-dielectric-constant insulating film such as $SiO_2$ or an etching stop film such as SiCN.

The via wiring 5 is provided in the via hole 4. The via wiring 5 is provided between the lower wiring layer 2 and the first conductive layers 9. The via wiring 5 is provided to connect upper wiring layers including the graphene 7 to lower wiring layers including the lower wiring layer 2. Conductive materials that may be used for the via wiring 5 include carbon-based conductors such as carbon nanotubes and graphene, metals such as Cu, W, Al, and Si (polysilicon), and alloys containing any of these metals.

The catalyst metal film 6 is a metal film provided between the first interlayer insulating film 3 and the graphene 7. The catalyst metal film 6 serves as a catalyst for growing the graphene 7 from a carbon material. An underlying layer may be provided between the catalyst metal film 6 and the first interlayer insulating film 3, and the underlying layer may have a multilayer structure in which two or more different conductive materials are stacked. The underlying layer preferably functions as a co-catalyst for the growth of graphene. The catalyst metal film 6 is preferably made of an element such as Co, Ni, Fe, Ru, or Cu or an alloy containing any of these elements. The catalyst metal film 6 is preferably a continuous film for large-area growth of graphene. Transfer printing or the like may be used to deposit the graphene 7 on the first interlayer insulating film 3. In this case, catalytic growth of the graphene 7 is not necessary, and therefore, the catalyst metal film 6 may be omitted. The catalyst metal film 6 may also be provided between the via wiring 5 and the first conductive layer 9.

The graphene 7 is multilayer graphene provided on the first interlayer insulating film 3 or the catalyst metal film 6. The graphene 7 is provided to electrically connect the via wiring 5 to the first conductive layers 9 and the second conductive layers 10. The top surface of the graphene 7 is connected to the third conductive layer 11. The second conductive layers 10 on the sides of the graphene 7 are connected to the third conductive layer 11 on the top surface of the graphene 7. The wiring has a reduced resistance because the second conductive layers 10 on the sides of the graphene 7 are connected to the third conductive layer 11 on the top surface of the graphene 7 so that there is a large connection area between the graphene 7 and the second conductive layers 10 made of a conductive metal.

The graphene 7 is preferably doped with an atom from the third conductive layer 11, so that the graphene 7 can have an increased state density. Preferably, as the state density increases, the contact resistance between the graphene 7 and the first conductive layers 9 decreases.

An insulating film may also be provided on the top surface of the first or second conductive layers 9 or 10 to insulate them from upper wiring or an upper substrate (not shown). Such an insulating film may be typically made of a low-dielectric-constant insulating film such as SiOC, an etching stop film such as SiCN, or $SiO_2$ or the like.

The first conductive layers 9 are provided to connect the via wiring 5 to the graphene 7. The first conductive layers 9 form a good contact with the via wiring 5 and the graphene. The first conductive layers 9 may be made of any of low-resistance metals. Among them, a catalytic metal such as Co, Ni, Pd, or Ru is preferably used to form the first conductive layers 9. Carbon can be easily dissolved into such a catalytic metal, so that the metal can form a good contact with the graphene 7.

The second conductive layers 10 are provided to form a low-resistance connection to the graphene 7. The second conductive layers 10 are also connected to the first conductive layers 9 to contribute to a reduction in the contact resistance between the graphene 7 and the first conductive layers 9. Materials that may be used to form the second conductive layers 10 include metals such as Ti, Ni, Co, Pd, Cr, Mo, W, Al, Cu, Ru, Ag, Au, Ir, and Pt and alloys containing any of these elements. The second conductive layers 10 are preferably made of a metal having a high carbon solubility limit so that a good contact with the graphene 7 can be expected or preferably made of an alloy containing such a metal. The metal having a high carbon solubility limit is preferably Ti, Ni, Co, Ta, Pd, or the like. The second conductive layers 10 may be made of the same material as the first conductive layers 9.

A metal with a work function significantly different from that of the graphene 7 may be used to form the third conductive layer 11. In this case, it can be expected that the contact resistance between the graphene 7 and the first conductive layers 9 would be reduced when the graphene 7 is doped with the metal used in the third conductive layer 11. The doping can also be expected to reduce the contact resistance between the graphene 7 and the second conductive layers 10. From this viewpoint, the third conductive layer 11 is preferably made of a metal such as Ti, Ni, Co, Pd, Cr, Mo, W, Al, Cu, Ru, Ag, Au, Ir, or Pt or an alloy containing any of these elements. The third conductive layer 11 may also be made of the same material as the first or second conductive layers 9 or 10.

A process for manufacturing Example 1 will be described with reference to FIGS. 8 to 14, which are cross-sectional views showing a process for manufacturing a semiconductor device having the wiring of FIG. 14.

Figure 8:
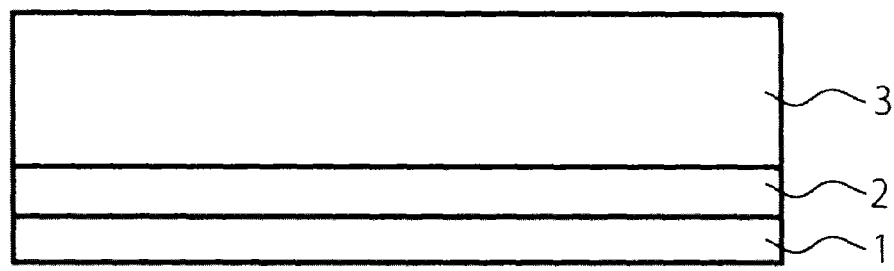
FIG. 8 is a cross-sectional view showing a process for manufacturing a semiconductor device having a wiring of an embodiment.

FIG. 8 shows the step of forming a lower wiring layer and an interlayer insulating film. First, a lower wiring layer 2 is formed on a substrate 1 on which a semiconductor integrated circuit and so on have been formed. The method of forming the lower wiring layer 2 may be, for example, chemical vapor deposition (CVD). A first interlayer insulating film 3 is then formed on the lower wiring layer 2.

Figure 9:
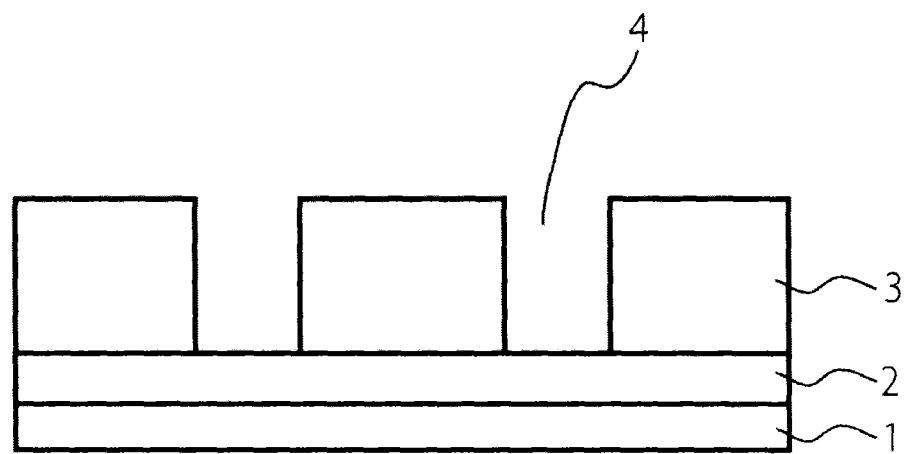
FIG. 9 is a cross-sectional view showing a process for manufacturing a semiconductor device having a wiring of an embodiment.

Subsequently, as shown in the process sectional view of FIG. 9, via holes 4 passing through the first interlayer insulating film 3 to the lower wiring layer 2 are formed, for example, by dry etching using fluorine-based gas.

Figure 10:
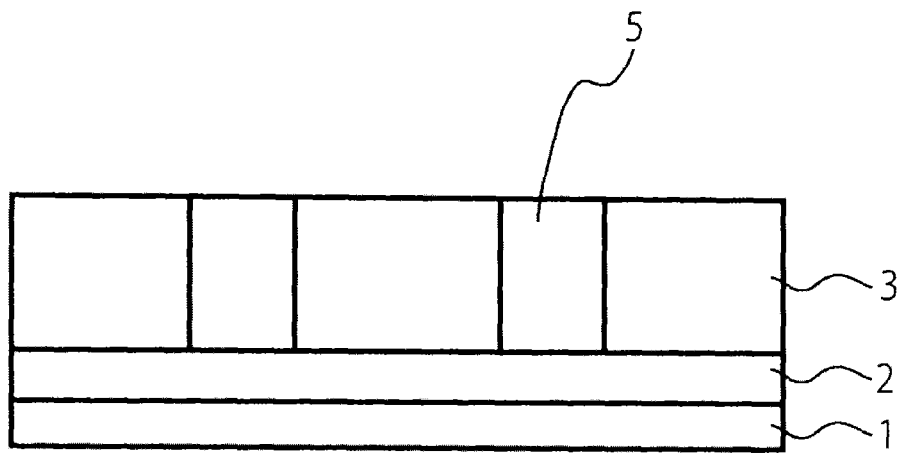
FIG. 10 is a cross-sectional view showing a process for manufacturing a semiconductor device having a wiring of an embodiment.

As shown in FIG. 10, via wiring 5 is then formed in each via hole 4. In this case, the via wiring 5 may be made of carbon nanotubes or a metal element such as Cu. For example, the via wiring 5 of carbon nanotubes can be grown from supplied hydrocarbon gas or the like by thermal CVD or plasma CVD using, as a catalyst, a catalyst metal film formed at the bottom of the via holes 4. The via wiring 5 of a metal element such as Cu can be formed by plating or sputtering. In both cases, chemical mechanical polishing (CMP) may be performed for planarization.

Figure 11:
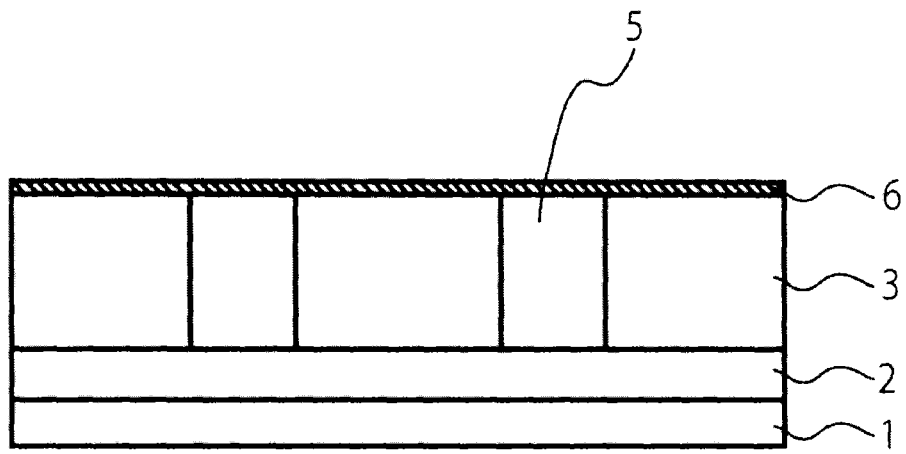
FIG. 11 is a cross-sectional view showing a process for manufacturing a semiconductor device having a wiring of an embodiment.

Subsequently, as shown in the process sectional view of FIG. 11, a catalyst metal film 6 for graphene growth is formed on the first interlayer insulating film 3 and the via wiring 5. In this step, an underlying layer may be formed before the catalyst metal film 6, and the underlying layer may have a multilayer structure in which two or more different conductive materials are stacked. The underlying layer preferably functions as a co-catalyst for the growth of graphene. Although not shown, a second interlayer insulating film 12 is formed in a pattern corresponding to the graphene 7 wiring pattern, before the catalyst metal film 6 is formed.

Figure 12:
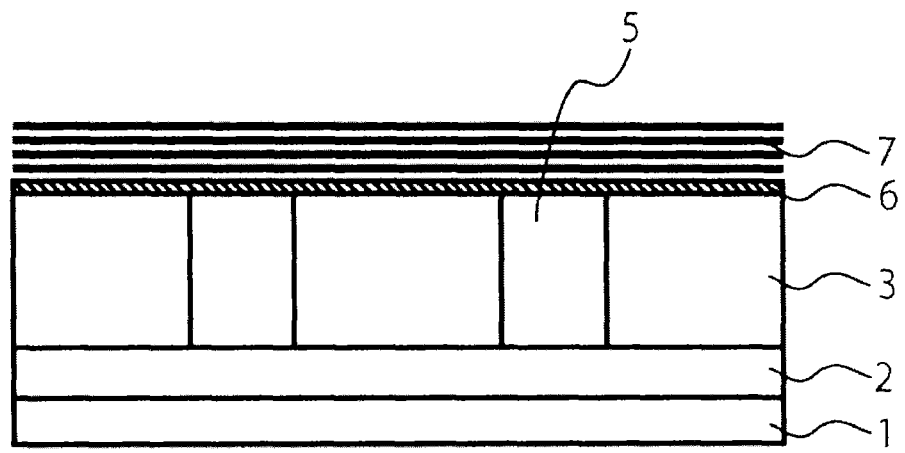
FIG. 12 is a cross-sectional view showing a process for manufacturing a semiconductor device having a wiring of an embodiment.

Subsequently, as shown in the process sectional view of FIG. 12, graphene 7 is grown on the catalyst metal film 6. Graphene may be grown, for example, by thermal CVD or plasma CVD. When plasma CVD is used, the graphene 7 may be grown by a process including heating the substrate to, for example, 500° C. in a reactor, introducing hydrocarbon gas, such as methane gas, as raw material gas and hydrogen as carrier gas, subjecting the methane gas to excitation and discharge, for example, using a microwave to form a plasma of the raw material gas, and allowing the plasma to react with the catalyst metal film 6 for graphene growth to form the graphene 7 having a multilayer structure including two or more layers.

Alternatively, multilayer graphene may be grown on another substrate where a catalyst metal film has been formed, and the graphene may be separated from the catalyst metal film and transferred onto the first interlayer insulating film 3 and the via wiring 5 to form the graphene 7.

Figure 13:
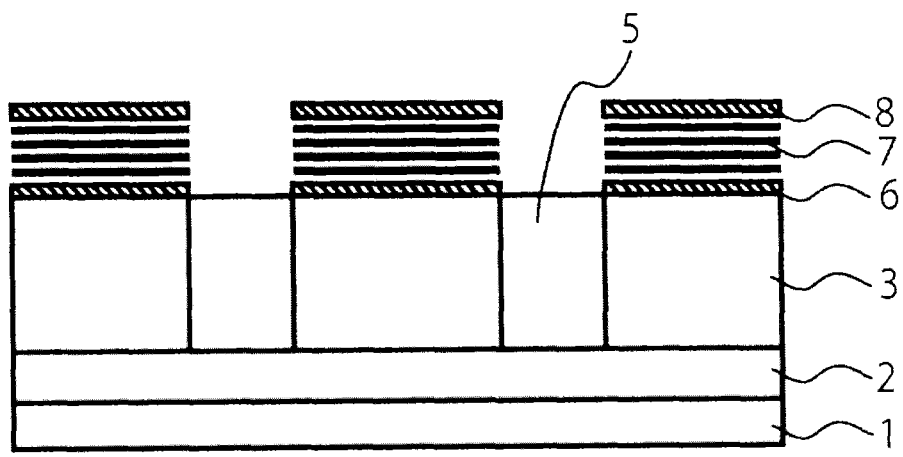
FIG. 13 is a cross-sectional view showing a process for manufacturing a semiconductor device having a wiring of an embodiment.

Subsequently, as shown in the process sectional view of FIG. 13, an insulating film 8 is formed as an etching mask on the graphene 7, and part of the graphene 7 on the via wiring 5 is removed by dry etching using, for example, oxygen-based gas.

Figure 14:
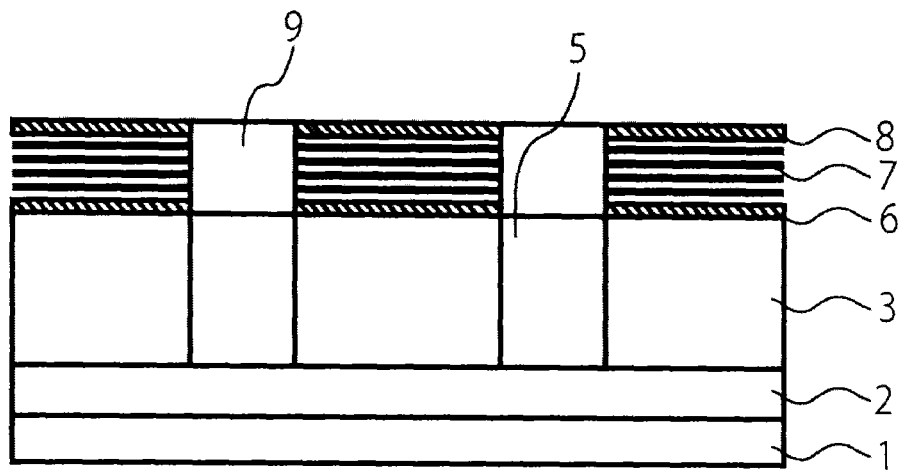
FIG. 14 is a cross-sectional view showing a process for manufacturing a semiconductor device having a wiring of an embodiment.

As shown in the process sectional view of FIG. 14, first conductive layers 9 are then formed. The first conductive layers 9 may be formed using a deposition method such as physical vapor deposition (PVD) or chemical vapor deposition (CVD). Lift-off method or planarization polishing by CMP is then performed to form the structure of FIG. 14. As shown in the process sectional view of FIG. 14, the first conductive layers 9 are formed so as to connect to the sides of the graphene 7. In this step, for example, the substrate may be heated in the reactor so that the reaction can proceed at the interface between the first conductive layers 9 and the graphene 7 to reduce the contact resistance.

Dry etching or wet etching is then performed to remove part of the insulating film 8 on the graphene 7 and part of the insulating film 8 in the vicinity of the interface between the graphene 7 and the first conductive layers 9. Subsequently, second conductive layers 10 and a third conductive layer 11 are formed in such a manner that the regions exposed by the etching are filled and covered with the layers 10 and 11, so that the layers 10 and 11 are formed to connect to the sides and top surface of the graphene 7. The second and third conductive layers 10 and 11 may be formed using a deposition method such as PVD or CVD. Lift-off method or planarization polishing by CMP is then performed to form the wiring structure of FIG. 5. When the second and third conductive layers 10 and 11 are made of the same material, the second and third conductive layers 10 and 11 may be formed at the same time. The steps of FIGS. 8 to 14 may be repeated to form a multilayer wiring structure.

Example 2

Figure 15:
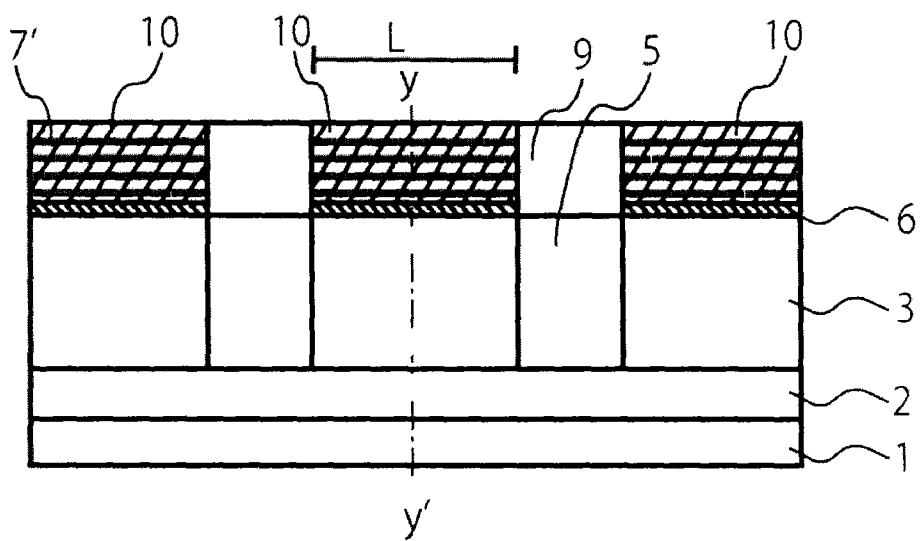
FIG. 15 is a schematic cross-sectional view of a semiconductor device having a wiring of an embodiment.

FIG. 15 is a schematic cross-sectional view of part of a semiconductor device of Example 2 including vertical wiring (via wiring) and horizontal wiring (graphene wiring). In the cross-sectional view of FIG. 15, the second conductive layers 10 are formed on only part of the second sides of the graphene 7 opposite to each other in the widthwise direction of the wiring, and such part is on the first conductive layer 9-side. In Example 2, however, the second conductive layers 10 are provided on the whole of the second sides of the graphene 7 opposite to each other in the widthwise direction of the wiring.

Figure 16:
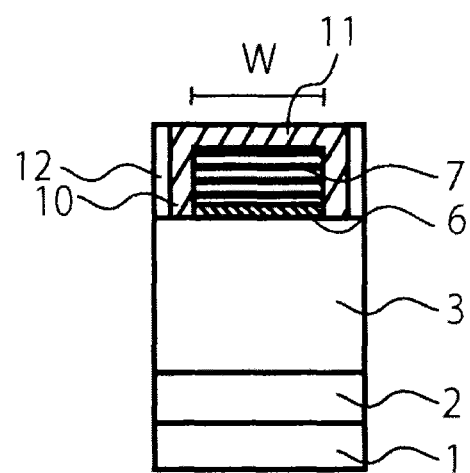
FIG. 16 is a schematic cross-sectional view of a semiconductor device having a wiring of an embodiment.

FIG. 16 is a cross-sectional view along the line y-y' in FIG. 15. The sides of the graphene 7 opposite to each other in the widthwise direction of the wiring (the side walls of the graphene) are connected not to the second interlayer insulating film 12 but to the second conductive layers 10. The connection area between the graphene 7 and the second conductive layers 10 is larger in Example 2 than in Example 1. Therefore, the wiring of the semiconductor device of Example 2 is advantageous in that its resistance is further reduced as compared to Example 1.

The basic process for manufacturing the wiring of the semiconductor device of Example 2 is the same as that for Example 1. The manufacturing method for Example 2 differs from that for Example 1 in that the second conductive layers 10 are formed on the whole of the second sides of the graphene 7 opposite to each other in the widthwise direction of the wiring. The method may include, for example, performing dry etching or wet etching to remove part of the insulating film 8 on the graphene 7 and part of the insulating film 8 in the vicinity of the interface between the graphene 7 and the first conductive layers 9 and to further remove entirely part of the second interlayer insulating film 12 in contact with the second sides of the graphene 7 opposite to each other in the widthwise direction of the wiring; and then forming the second conductive layers 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene wiring comprising:
    graphene;
    first conductive layers;
    second conductive layers; and
    a third conductive layer,
    wherein the first conductive layers are connected to first sides of the graphene opposite to each other in a longitudinal direction of the wiring,
    the second conductive layers are connected to second sides of the graphene opposite to each other in a widthwise direction of the wiring,
    the third conductive layer is connected to a top surface of the graphene, and
    the first and second conductive layers are connected to each other.

2. The wiring according to claim 1, wherein
    the graphene has a multilayer structure including at least two layers, and
    the first sides of the graphene opposite to each other in the longitudinal direction of the wiring and the second sides of the graphene opposite to each other in the widthwise direction of the wiring are a layered surface of multilayer graphene.

3. The wiring according to claim 1, wherein the second conductive layers are connected to the whole of the second sides of the graphene opposite to each other in the widthwise direction of the wiring.

4. The graphene wiring according to claim 1, wherein the third conductive layer is connected to one or both of the first and second conductive layers.

5. The wiring according to claim 1, wherein the graphene has a width of 5 nm to 100 nm.

6. The graphene wiring according to claim 1, wherein at least one of the first, second, and third conductive layers is connected by adhesion to the graphene.

7. A semiconductor device comprising a graphene wiring, the graphene wiring comprising:
    graphene;
    first conductive layers;
    second conductive layers; and
    a third conductive layer,
    wherein the first conductive layers are connected to first sides of the graphene opposite to each other in a longitudinal direction of the wiring,
    the second conductive layers are connected to second sides of the graphene opposite to each other in a widthwise direction of the wiring,
    the third conductive layer is connected to a top surface of the graphene, and
    the first and second conductive layers are connected to each other.

8. The device according to claim 7, wherein
    the graphene has a multilayer structure including at least two layers, and
    the first sides of the graphene opposite to each other in the longitudinal direction of the wiring and the second sides of the graphene opposite to each other in the widthwise direction of the wiring are a layered surface of multilayer graphene.

9. The device according to claim 7, wherein the second conductive layers are connected to the whole of the second sides of the graphene opposite to each other in the widthwise direction of the wiring.

10. The device according to claim 7, wherein the third conductive layer is connected to one or both of the first and second conductive layers.

11. The device according to claim 7, wherein the graphene has a width of 5 nm to 100 nm.

12. The device according to claim 7, wherein at least one of the first, second, and third conductive layers is connected by adhesion to the graphene.

* * * * *